US010693046B2

(12) United States Patent
Chen et al.

(10) Patent No.: US 10,693,046 B2
(45) Date of Patent: Jun. 23, 2020

(54) CHIP SCALE PACKAGING LIGHT EMITTING DEVICE AND MANUFACTURING METHOD OF THE SAME

(71) Applicant: MAVEN OPTRONICS CO., LTD., Hsinchu (TW)

(72) Inventors: Chieh Chen, Palo Alto, CA (US); Tsung-Hsi Wang, Hsinchu (TW)

(73) Assignee: Maven Optronics CO., LTD., Hsinchu County (TW)

( * ) Notice: Subject to any disclaimer, the term of this patent is extended or adjusted under 35 U.S.C. 154(b) by 0 days.

(21) Appl. No.: 15/389,417

(22) Filed: Dec. 22, 2016

(65) Prior Publication Data

US 2017/0194538 A1    Jul. 6, 2017

(30) Foreign Application Priority Data

Dec. 30, 2015  (TW) .............................. 104144441 A
Jan. 7, 2016  (CN) .......................... 2016 1 0009956

(51) Int. Cl.
*H01L 33/54* (2010.01)
*H01L 33/50* (2010.01)
(Continued)

(52) U.S. Cl.
CPC ............ *H01L 33/54* (2013.01); *H01L 33/486* (2013.01); *H01L 33/505* (2013.01); *H01L 33/56* (2013.01);
(Continued)

(58) Field of Classification Search
CPC ....... H01L 2924/00; H01L 2924/00014; H01L 2224/16225; H01L 2224/73204;
(Continued)

(56) References Cited

U.S. PATENT DOCUMENTS

2004/0223315 A1* 11/2004 Suehiro ................. H01L 33/507
362/84
2006/0105484 A1    5/2006 Basin et al.
(Continued)

FOREIGN PATENT DOCUMENTS

EP    1 657 756 A2    5/2006
EP    1 657 758 A2    5/2006
(Continued)

OTHER PUBLICATIONS

Office Action for Taiwan Patent Application No. 104144441, dated Sep. 23, 2016, 6 pages.
(Continued)

Primary Examiner — Tony Tran
(74) Attorney, Agent, or Firm — Foley & Lardner LLP

(57) ABSTRACT

A Chip-Scale Packaging (CSP) LED device and a method of manufacturing the same are disclosed. The CSP LED device includes a flip-chip LED semiconductor die and a packaging structure, wherein the packaging structure comprises a soft buffer layer, a photoluminescent structure and an encapsulant structure. The soft buffer layer includes a top portion formed on top of the flip-chip LED semiconductor die, and an edge portion formed covering an edge surface of the flip-chip LED semiconductor die, wherein the top portion has a convex surface, and the edge portion has an extension surface smoothly adjoining the convex surface. The photoluminescent structure is formed on the soft buffer layer covering the convex surface and the extension surface of the soft buffer layer. The encapsulant structure, which has a hardness not lower than that of the buffer layer, is formed on the photoluminescent structure. Therefore, the CSP LED device has improved reliability by improving adhesion strength between the flip-chip LED semiconductor die and the packaging structure, and improved optical performance
(Continued)

such as more consistent correlated color temperature (CCT), more uniform spatial color, and higher optical efficacy.

15 Claims, 8 Drawing Sheets

(51) Int. Cl.
H01L 33/58 (2010.01)
H01L 33/48 (2010.01)
H01L 33/56 (2010.01)
H01L 33/00 (2010.01)
H01L 21/56 (2006.01)

(52) U.S. Cl.
CPC ............ *H01L 33/58* (2013.01); *H01L 21/568* (2013.01); *H01L 33/0095* (2013.01); *H01L 2224/04105* (2013.01); *H01L 2224/19* (2013.01); *H01L 2933/005* (2013.01); *H01L 2933/0033* (2013.01); *H01L 2933/0041* (2013.01); *H01L 2933/0058* (2013.01); *H01L 2933/0091* (2013.01)

(58) Field of Classification Search
CPC . H01L 2224/32225; H01L 2224/48091; H01L 2924/181; H01L 2924/0001
See application file for complete search history.

(56) References Cited

U.S. PATENT DOCUMENTS

| | | |
|---|---|---|
| 2006/0118973 A1 | 6/2006 | Harada et al. |
| 2008/0099771 A1 | 5/2008 | Jong et al. |
| 2010/0119839 A1 | 5/2010 | Chen |
| 2010/0123386 A1 | 5/2010 | Chen |
| 2013/0168709 A1 | 7/2013 | Lin |
| 2013/0181167 A1 | 7/2013 | Takayuki et al. |
| 2013/0234187 A1 | 9/2013 | Ebe et al. |
| 2013/0285087 A1 | 10/2013 | Wang et al. |
| 2013/0313594 A1 | 11/2013 | Han et al. |
| 2014/0361318 A1 | 12/2014 | Miki et al. |
| 2015/0221620 A1* | 8/2015 | Park ................ H01L 33/54 257/88 |

FOREIGN PATENT DOCUMENTS

| | | | |
|---|---|---|---|
| JP | 2003-31848 | A | 1/2003 |
| JP | 2009-94351 | A | 4/2009 |
| JP | 2011-71341 | A | 4/2011 |
| JP | 2012-508987 | A | 4/2012 |
| JP | 2013-144757 | A | 7/2013 |
| JP | 2013-214716 | A | 10/2013 |
| JP | 2014-220475 | A | 11/2014 |
| KR | 2006-0054154 | A | 5/2006 |
| KR | 2011-0099102 | A | 9/2011 |
| TW | 201119090 | A | 6/2011 |
| TW | 201143163 | A | 12/2011 |
| TW | 201327940 | A | 7/2013 |
| TW | 201344979 | A | 11/2013 |
| TW | 201511370 | A | 3/2015 |
| WO | WO-2010/057019 | A2 | 5/2010 |

OTHER PUBLICATIONS

Search Report for Taiwan Patent Application No. 104144441, dated Sep. 23, 2016, 1 page.
Extended Search Report for EP Patent Application No. 16206749.0, dated Feb. 7, 2017, 8 pages.
Office Action and Search Report for corresponding Chinese Patent Application No. 201610009956.7, dated Jun. 1, 2018, 6 pages.
Office Action from corresponding Japanese Patent Application No. 2016-257288, dated Feb. 15, 2018, 6 pgs.
Office Action for corresponding Korean Patent Application No. 10-2016-0183990, dated Jan. 19, 2018, 6 pgs.
Decision of Rejection for corresponding Korean Patent Application No. 10-2016-0183990, dated Jul. 31, 2018, 3 pgs.
Office Action from corresponding Japanese Patent Application No. 2016-257288, dated Nov. 6, 2018, 6 pgs.

* cited by examiner

CHIP SCALE PACKAGING LIGHT EMITTING DEVICE AND MANUFACTURING METHOD OF THE SAME

CROSS-REFERENCES TO RELATED APPLICATIONS

This application claims the benefit of and priority to Taiwan Patent Application No. 104144441 filed on Dec. 30, 2015, and Chinese Patent Application No. 201610009956.7 filed on Jan. 7, 2016, which also claims priority to the Taiwan Patent Application, the disclosures of which are incorporated herein by reference in their entirety.

BACKGROUND

Technical Field

The present disclosure relates to a light emitting device and the manufacturing method thereof, in particular to a chip-scale packaging light emitting diode (LED) device, which includes a flip-chip LED semiconductor die generating optical radiation while in operation.

Descriptions of the Related Art

LEDs are widely used in various applications including traffic lights, backlight units, general lightings, portable devices, automotive lighting and so forth. Generally, an LED semiconductor die is disposed inside a package structure, such as a lead frame, to form a packaged LED device. It may further be disposed and covered by photoluminescent materials, such as phosphors, to form a phosphor-converted white LED device.

Recent development of a chip-scale packaging (CSP) LED device has attracted more and more attention due to its promising advantages. As a typical example, a white-light CSP LED device is generally composed of a blue-light LED semiconductor die and a photoluminescent structure covering the LED semiconductor die in a compact chip-scale size. The blue LED semiconductor die is typically a flip-chip LED die emitting blue light from an upper surface and four peripheral edge surfaces simultaneously. The photoluminescent structure is disposed covering the LED semiconductor die to down-convert the wavelength of the blue light emitted from the upper surface as well as the four peripheral edge surfaces. After passing through the photoluminescent structure, a portion of the blue light is converted into a higher wavelength (lower energy) light, and the light with different wavelength spectrum is subsequently mixed in a prescribed ratio to generate a desired color temperature white light. In order to achieve the purpose of converting blue light uniformly, it is desired that a photoluminescent structure has the same thickness and the same distribution density of a photoluminescent material on the upper surface and the four peripheral edge surfaces, namely forming a conformal coating layer of the photoluminescent structure.

In comparison with a plastic leaded chip carrier (PLCC) LED device, a CSP light emitting device shows the following advantages: (1) The material cost is considerably less by eliminating the use of a bonding wire and a lead frame. (2) The thermal resistance between a LED semiconductor die and a mounting substrate, typically a printed circuit board (PCB), is further reduced without using a lead frame in between. Therefore the LED operation temperature is lowered while under the same driving current. In other words, less electrical energy can be consumed to obtain more optical power for a CSP LED device. (3) A lower operation temperature provides a higher LED semiconductor quantum efficiency for a CSP LED device. (4) A much smaller form factor of the light source provides more design flexibility for module-level LED fixtures. (5) A CSP LED device having a small light emitting area more resembles a point source and thus makes the design of secondary optics easier. A compact CSP LED device can be designed to generate small-Etendue light with higher optical intensity that is specified for some projected light applications, such as automobile headlights.

Even though CSP LED devices have many advantages, however, the adhesion strength between a photoluminescent structure and an LED semiconductor die is relatively weak compared to that of PLCC type LED devices. For a CSP LED device, a lead frame or a submount may be omitted; thus the photoluminescent structure can primarily or solely make surface contact with the LED semiconductor die, without additional surface contact with a lead frame or submount. Therefore, the contact area of the photoluminescent structure is relatively reduced to just the LED semiconductor die surface without additional contact to the submount area. Reduced bonding area generally results in a poor bonding force between the photoluminescent structure and the LED semiconductor die. Further, the coefficient of thermal expansion (CTE) of a photoluminescent structure material (generally comprised of organic resin materials) is typically much larger than that of an LED semiconductor die material (generally comprised of inorganic materials). While operating a CSP LED device, a noticeable CTE mismatch during a thermal cycle will induce internal stress between the interfaces of these two materials. Because of the poor adhesion strength to the LED semiconductor die, the photoluminescent structure tends to be easily delaminated and peeled off from the LED semiconductor die. Delamination of the photoluminescent structure is one of the major CSP failure mechanisms during operation of a CSP-type LED device. This shortcoming impacts the reliability of a CSP LED device and poses practical constraints for CSP LED applications.

Another problem of a CSP-type LED device is poor color uniformity. There are two major mechanisms causing poor color uniformity: 1. Inconsistent mechanical dimensions of a photoluminescent structure, and 2. Uncontrollable phosphor particle distribution inside the photoluminescent structure from one device to another device. In a comparative manufacturing process to fabricate CSP-type LED devices, firstly, phosphor particles are mixed within a binder resin material to form a phosphor slurry; and subsequently, the phosphor slurry is disposed on an LED semiconductor die using methods including molding, screen printing, spraying or the like to form a photoluminescent structure. It will be appreciated that, when the phosphor slurry is used to form a photoluminescent structure, precise control of geometric dimensions of the photoluminescent structure is desired to achieve a desired correlated color temperature (CCT) of a CSP LED device. However, it is quite challenging to control the dimensions of each photoluminescent structure precisely and consistently in a mass production fabrication process. Even if geometric dimensions of a photoluminescent structure are accurately controlled during mass production, there is lack of a mechanism to control the particle distribution of phosphor materials inside the photoluminescent structure. In fact, distribution control of phosphor materials is one of the most important factors determining optical properties, such as CCT, of a CSP LED device. It is therefore highly desirable to achieve conformal coating of phosphor particles over an upper surface and four edge surfaces of an LED semiconductor die to form a photoluminescent structure, so that consistent optical conversion properties of CSP LED devices can be achieved in a mass production fabrication process.

Specifically, several manufacturing stages in a mass production process could result in poor color uniformity for CSP-type LED devices resulting in a low manufacturing yield. For example, if a photoluminescent structure of a CSP LED device is formed from a phosphor slurry through molding (or screen printing) process, a prerequisite stage is to arrange a plurality of LED semiconductor dies to form an array inside an inner surface of a mold (or a stencil). However, imprecise arrangement to form an array of LED semiconductor dies will create inconsistent thickness on a top side and edge sides of a photoluminescent structure. Besides, after an array of photoluminescent structures is formed, a singulation process is usually used subsequently to separate the array of CSP LED devices. Imperfect position control of a dicing saw will result in inconsistent thickness on the edge surfaces of a photoluminescent structure from one CSP LED device to another CSP LED device. Also, attaining color uniformity is impeded in that the particle distribution of phosphor materials inside the phosphor slurry could not be controlled. As a result, the light passing through inconsistent photoluminescent structures of LED devices will produce poor color uniformity. Even for an individual CSP LED device, poor spatial color uniformity over different viewing angles is not uncommon due to various phosphor conversion distances of a photoluminescent structure that blue light will experience. Poor color consistency causes a low manufacturing yield during mass production.

Alternatively, a spray coating process is another fabrication process to form a photoluminescent structure with a conformally coated phosphor layer. Issues caused by imprecise arrangement of LED semiconductor dies may be alleviated using a spraying process as compared to using molding or screen printing processes. However, other challenges occur if a photoluminescent structure is fabricated using a spraying process. It is found that it is difficult to retain phosphor particles next to vertical edge surfaces of the LED semiconductor dies because the gravity effect will cause phosphor particles precipitating during fabrication. This gravity effect will make it difficult to form a substantially continuous layer of the phosphor material on edge surfaces of an LED semiconductor die. Although a transparent and continuous resin layer can be formed on edge surfaces of an LED semiconductor die, the phosphor particle layer inside the resin material is locally discontinuous. In other words, a photoluminescent structure is fabricated using a spraying process will form substantially large and optically transparent structures of "voids". Blue light irradiated from the LED semiconductor die therefore leaks more from the voids, causing the blue light to directly pass through with less chance of wavelength conversion by the phosphor materials. It will be appreciated that the voids typically found on the four vertical edge surfaces will result in blue light leaking more from the edge surfaces of a CSP LED device. A blue ring is therefore generated for such CSP LED devices fabricated using this spraying process. In other words, a spraying process typically cannot be used to realize a photoluminescent structure with a desirable conformal coating of phosphor powder. Furthermore, if spraying process is used to form a thin photoluminescent structure, a top portion of the photoluminescent structure right on top of an LED semiconductor die tends to have particle aggregation effect. This aggregated phosphor powder distribution will generate substantially large optical voids comprised of optically transparent resin material without much phosphor material mixed inside. This phosphor material aggregation effect is the main reason for phosphor-converted LEDs having undesirable "blue light spots". The blue light leaking from the substantially large and substantially transparent voids may generate a locally strong intensity of blue light, which causes poor spatial color uniformity, and also poses the risk of blue-light hazard to human eyes. Other side effects due to phosphor powder aggregation include poor color uniformity, low manufacturing yield, and low phosphor wavelength conversion efficiency.

Another encountered issue when using CSP-type LED devices is the device reliability. One of the major technical features of a CSP-type LED device is that it does not possess a submount substrate or lead frame and directly exposes underneath bonding pads from an LED semiconductor die. Without a submount substrate, a photoluminescent structure of the CSP LED devices is exposed from underneath as well. A reflow soldering process is usually used when the CSP LED device is bonded onto an application substrate, such as a PCB. During the reflow soldering process, the soldering flux is typically utilized to improve the bonding quality between a CSP LED device and a substrate. However, the additives contained in the soldering flux tend to react with a benzene structure, which is widely found in silicone binder materials. However, a photoluminescent structure may be composed of a silicone resin material. This chemical reaction will form an adverse dark layer on the lower surface of a photoluminescent structure. The optical efficacy and reliability of the CSP LED device will suffer accordingly.

Therefore, providing a mass production solution is needed to address those aforementioned issues of CSP LED devices by providing improved interface adhesion strength between an LED semiconductor die and a photoluminescent structure, improving the spatial color uniformity and the CCT binning consistency, increasing the optical efficacy, and preventing the formation of an adverse dark layer on a lower surface of the photoluminescent structure.

SUMMARY

One object of some embodiments of the present disclosure is to provide CSP LED devices with a small irradiation area, improved reliability, spatial color uniformity, CCT binning consistency, optical efficacy, and lowered thermal resistance.

Another object of some embodiments of the present disclosure is to provide a manufacturing method to fabricate the disclosed CSP LED devices.

To achieve the objects, a CSP LED device, comprising an LED semiconductor die and a packaging structure, wherein the packaging structure includes a soft buffer layer, a photoluminescent structure and an encapsulant structure, is disclosed according to some embodiments of the present disclosure. The LED semiconductor die is a flip-chip LED semiconductor die having an upper surface, a lower surface, an edge surface, and a set of electrodes. The edge surface is formed and extends between the upper surface and the lower surface, and the set of electrodes is disposed on the lower surface. The soft buffer layer is made of, or includes, a polymer resin material in some embodiments. The soft buffer layer includes a top portion formed or disposed on the upper surface of the LED semiconductor die, and an edge portion formed covering the edge surface of the LED semiconductor die. The top portion exhibits a convex surface, and the edge portion possesses an extension surface adjoining the convex surface smoothly. The photoluminescent structure is formed on the soft buffer layer covering the convex surface and the extension surface. The photoluminescent structure comprises a resin binder material, such as silicone, epoxy, rubber and so forth, and a photoluminescent material dispersed within the binder material. The encapsulant structure, which can be made of a polymer material with hardness no less than that of the soft buffer layer, is formed on the photoluminescent structure.

To achieve the object above, a manufacturing method of a CSP LED device of some embodiments comprises: arranging a plurality of LED semiconductor dies on a release film to form an array of LED semiconductor dies; forming an array of connected packaging structures on the array of LED semiconductor dies; and singulating the array of packaging structures to form a plurality of CSP LED devices, wherein the release film can be removed before or after singulating the packaging structures.

The aforementioned method of forming an array of packaging structures on an array of LED semiconductor dies further comprises the following stages: 1. forming an array of soft buffer layers on an array of LED semiconductor dies, wherein a top portion of each of the soft buffer layers exhibiting a convex surface is disposed on an upper surface of each respective LED semiconductor die, and an edge portion of each of the soft buffer layers possessing an extension surface adjoining the top convex surface is formed to cover an edge surface of each respective LED semiconductor die; 2. forming an array of photoluminescent structures on the array of soft buffer layers covering the convex surfaces and the extension surfaces, wherein a method of depositing a photoluminescent material and a polymer material sequentially can be used to formed the photoluminescent structures; and 3. forming an array of encapsulant structures on the array of photoluminescent structures, wherein the encapsulant structure has hardness no less than that of the soft buffer layer.

Thus, the improved CSP LED devices according to some embodiments of the present disclosure provide at least the following benefits.

Firstly, the CSP LED devices according to some embodiments of the present disclosure have improved reliability during operation. For comparative CSP LED devices, a photoluminescent structure is formed to be in direct contact with an LED semiconductor die. It will be appreciated that the photoluminescent structure generally comprises of a ceramic phosphor material in a form of a powder dispersed inside a polymer binder material. However, a ceramic material typically will not form a chemical bond with an LED semiconductor die during CSP fabrication process and thus has low adhesion or bonding strength with the LED semiconductor die. Adhesion strength between the photoluminescent structure and the LED semiconductor die are mainly developed from the polymer binder material. When the phosphor powder is dispersed inside the polymer binder material, it decreases the contact area between the polymer material and the surface of LED semiconductor die, which accordingly reduces the bonding strength at the interface. In contrast, a soft buffer layer provides full contact between a polymer material and the LED semiconductor die for a CSP LED device according to some embodiments of the present disclosure. Therefore, the bonding force between a photoluminescent structure and an LED semiconductor die can be greatly improved by introducing a soft buffer layer. Thus the soft buffer layer functions as an adhesion promotion layer.

In addition, a soft buffer layer can have a lower hardness, which relieves the internal stress induced by the mismatch of CTEs among components in a CSP LED device. Thus the soft buffer layer also functions as a stress relief layer.

Therefore, reliability of a CSP LED device according to some embodiments of the present disclosure is greatly improved during operation by preventing a packaging structure from peeling off from an LED semiconductor die.

Secondly, an extension surface of an edge portion of a soft buffer layer according to some embodiments of the present disclosure is a relatively smooth surface with a smaller gradient of slope. The smaller gradient extension surface of a soft buffer layer is desirable so that it smoothens out a sharper vertical "step" of an edge surface of an LED semiconductor die. Without a smooth and smaller gradient soft buffer layer, a phosphor powder may tend to precipitate inside a binder material due to gravity force, therefore it may be difficult to retain the phosphor powder on the edge surface of the LED semiconductor die to form a substantially continuous conformal phosphor coating layer. On the other hand, a soft buffer layer according to some embodiments of the present disclosure can greatly reduce the effect of precipitation of the phosphor powders caused by gravity, and therefore a substantially continuous phosphor powder distribution is formed along the edge portion of the soft buffer layer. In other words, an approximate conformal coating with phosphor powder inside a photoluminescent structure is achieved according to some embodiments of the present disclosure. Therefore the issue of blue light leakage in CPS LED devices is resolved. Thus, the CSP LED device according to some embodiments of the present disclosure shows improved spatial color uniformity and improved CCT binning consistency. Thus, the soft buffer layer functions as a smooth layer to facilitate the formation of an approximate conformal coating of phosphor powder inside a photoluminescent structure.

Thirdly, according to some embodiments of the CSP LED device in the present disclosure, it is desired that a photoluminescent layer and a polymer resin layer are formed sequentially and separately, as disclosed, for example, in U.S. patent publication US2010/0119839 (which is incorporated by reference in its entirety), during a fabrication process of a photoluminescent structure. Using the disclosed phosphor deposition method, a highly compact phosphor layer can be formed. One advantage is that the phosphor particles are deposited as an uniform, thin, and compact conformal coating layer. Thus no substantially large "voids" of photoluminescent material will be formed accordingly. Consequently, the "blue light spots" phenomenon and the blue light leakage problem are resolved, and the risk of blue-light hazard to human eyes is reduced as well. Another advantage is that, once a photoluminescent structure with a high packing density is formed for a CSP LED device according to some embodiments of the present disclosure, the photoluminescent structure shows improved conversion efficiency, and thus the overall optical efficacy is improved.

Fourthly, according to some embodiments of the CSP LED device in the present disclosure, it is desired that the manufacturing material to form a soft buffer layer is chosen from polymer materials without containing substances (e.g., benzene) that will chemically react with additives contained in soldering flux. A reflow soldering process is usually used when a CSP LED device is bonded onto an application substrate, such as a PCB. During the reflow soldering process, the soldering flux is typically utilized to improve the bonding quality between the CSP LED device and the substrate. However, the additives contained in the soldering flux tend to react with benzene, which is found in silicone binder materials. This chemical reaction will form an adverse dark layer on the lower surface of a photoluminescent structure if it is made of a polymer material containing benzene. However, if a soft buffer layer is comprised of a polymer material without or substantially devoid of benzene, it will isolate the photoluminescent structure from touching the flux additives during the subsequent bonding process. Therefore, when a CSP LED device is bonded onto a substrate through a reflow soldering process, the additives contained in the soldering flux are substantially confined by the soft buffer layer to the underneath area of the CSP LED device and refrained from reaching the photoluminescent structure. Thus, this adverse chemical reaction is largely avoided between the additives of the soldering flux and benzene (for example), which is found in silicone binder materials used to fabricate a photoluminescent structure. Accordingly, a dark layer resulting from this chemical reaction is greatly reduced, and another degradation mode on optical efficacy and reliability of a CSP LED device is avoided. In other words, the soft buffer layer also functions as an environmental barrier layer.

Other aspects and embodiments of the disclosure are also contemplated. The foregoing summary and the following detailed description are not meant to restrict the disclosure to any particular embodiment but are merely meant to describe some embodiments of the disclosure.

DETAILED DESCRIPTION

Definitions

Figure 1A:
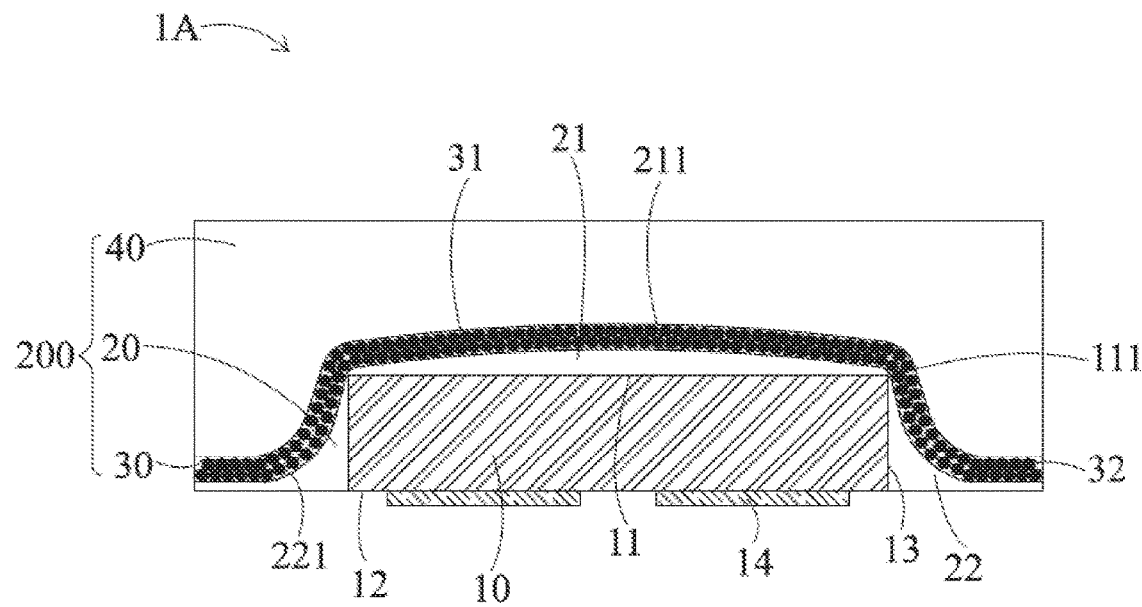
FIG. 1A, FIG. 1B, and FIG. 1C are schematic drawings in cross-sectional views of a CSP LED device according to a first embodiment of the present disclosure.

The following definitions apply to some of the technical aspects described with respect to some embodiments of the disclosure. These definitions may likewise be expanded upon herein.

As used herein, the singular terms "a," "an," and "the" include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the object can refer to an average of various orthogonal dimensions of the object. Thus, for example, a size of an object that is a spheroidal can refer to an average of a major axis and a minor axis of the object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

FIG. 1A shows a schematic drawing in a cross-sectional view of a first embodiment of a CSP LED device according to the present disclosure. The CSP LED device 1A comprises an LED semiconductor die 10 and a packaging structure 200, wherein the packaging structure 200 includes a soft buffer layer 20, a photoluminescent structure 30 and an encapsulant structure 40.

The LED semiconductor die 10 is a flip-chip LED semiconductor die having an upper surface 11, a lower surface 12, an edge surface 13, and a set of electrodes 14. The upper surface 11 and the lower surface 12 are formed substantially in parallel, facing oppositely to each other. The edge surface 13 is formed and extends between the upper surface 11 and the lower surface 12, connecting an outer rim 111 of the upper surface 11 with that of the lower surface 12. In other words, the edge surface 13 is formed along the outer rim 111 of the upper surface 11 and the outer rim of the lower surface 12.

A set of electrodes 14, or a plurality of electrodes, is disposed on the lower surface 12. Electric energy (not illustrated) is applied to the LED semiconductor die 10 through the set of electrodes 14 so that electro-luminescence is generated and irradiated from the upper surface 11 and the edge surface 13. No electrodes are disposed on the upper surface 11 in this flip-chip type semiconductor die 10 of the depicted embodiment.

The soft buffer layer 20 is disposed so as to: 1) relieve the internal stress induced by the mismatch of CTEs among the components of the CSP LED device 1A, 2) increase the bonding strength between the LED semiconductor die 10 and the packaging structure 200, and 3) facilitate the formation of the photoluminescent structure 30 on the soft buffer layer 20 to achieve approximately conformal coating. Specifically, the soft buffer layer 20 is a relatively soft material desirably made of a transparent polymer material, such as silicone, epoxy, rubber, and so forth. For the purpose of illustration, the soft buffer layer 20 comprises a top portion 21 and an edge portion 22 (formed by one single process concurrently). The top portion 21 is formed on the upper surface 11 of the LED semiconductor die 10, and the edge portion 22 is formed covering the edge surface 13 of the LED semiconductor die 10. In addition, the soft buffer layer 20 substantially completely covers the upper surface 11 and the edge surface 13 of the LED semiconductor die 10, but does not cover the set of electrodes 14 of the LED semiconductor die 10.

Figure 1B:
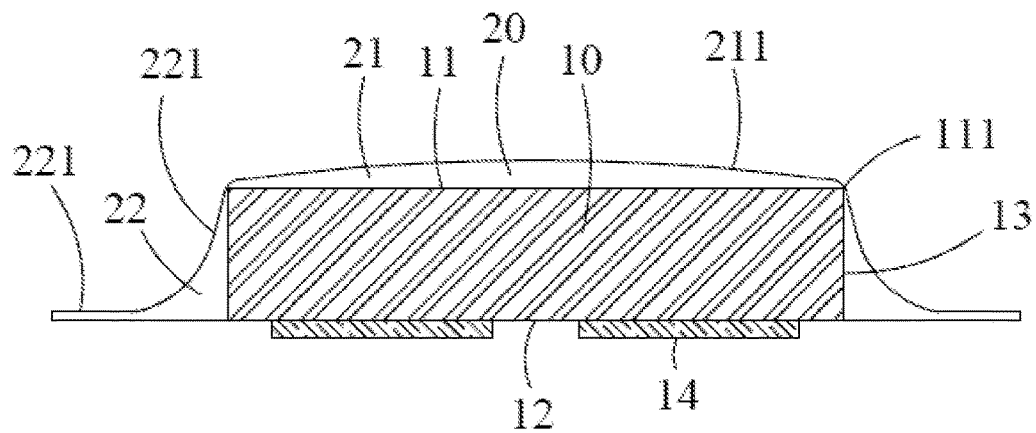

As shown in FIG. 1B (a cross-sectional view of the CSP LED device 1A without including the photoluminescent structure 30 and the encapsulant structure 40), the top portion 21 exhibits a convex surface 211 (an upper surface of the top portion 21). The highest point of the convex surface 211 is near a center point of the upper surface 11 and aligned with the optical axis of the LED semiconductor die 10, and the lowest point of the convex surface is close to the outer rim 111 of the upper surface 11. Since the soft buffer layer 20 is desirably made of a liquid polymer material through curing, a convex shape is formed due to the effect of coherent force of the liquid polymer material. Thereby the top portion 21 exhibits the convex surface 211. It is desired that the distance (along a vertical direction depicted in FIG. 1B) from the highest point of the convex surface 211 to the upper surface 11 is smaller than about half of the thickness of the LED semiconductor die 10 so that the convex surface 211 does not have a steep slope, which will facilitate a subsequent formation of a substantially continuous phosphor layer. For example, the distance from the highest point of the convex surface 211 to the upper surface 11 may be about 45% or less, about 40% or less, about 30% or less, about 20% or less, or about 15% or less of the thickness of the LED semiconductor die 10.

The edge portion 22 has an extension surface 221 (an upper surface of the edge portion 22) connecting to the convex surface 211. It will be appreciated that the extension surface 221 is continuously connected to the convex surface 211 so that both the extension surface 221 and the convex surface 211 generally have substantially the same curvature at the adjoining border. Subsequent formation of the photoluminescent structure 30 on the soft buffer layer 20 will benefit from the continuously or smoothly connected extension surface 221 and convex surface 211.

The extension surface 221 and the convex surface 211 may connect and adjoin each other near the outer rim 111 of the upper surface 11 of the LED semiconductor die 10, so that the outer rim 111 is approximately tangent to or close to the convex surface 211 and the extension surface 221. In other words, the outer rim 111 of the LED semiconductor die 10 and the adjoining border between the extension surface 221 and the convex surface 211 are substantially in parallel with a reduced shift or spacing, and this shift is desirably as small as allowed and is specified by the fabrication capability of the manufacturing process.

It is desired that the extension surface 221 includes a concave surface, as illustrated in FIG. 1B; in other words, the curvature of the extension surface 221 is opposite to the curvature of the convex surface 211. In addition, the extension surface 221 becomes more flat further away from the edge surface 13 of the LED semiconductor die 10, and the curvature finally approaches zero. The extension surface 221 having this desired profile will facilitate the formation of the photoluminescent structure 30. According to other embodiments, the extension surface 221 may include a beveled surface (FIG. 1D) or a convex surface (FIG. 1E).

It is desired that the soft buffer layer 20 is formed by spraying a liquid polymer material, such as silicone, onto the LED semiconductor die 10, wherein the polymer material adheres to the upper surface 11 and the edge surface 13 of the LED semiconductor die 10. By the interaction of surface tension and coherent force inside the liquid polymer material itself, the soft buffer layer 20 having the top portion 21 and the edge portion 22 is shaped accordingly and formed after the curing process.

The soft buffer layer 20 has a relatively low hardness to relieve the internal stress, which is induced by the CTE mismatch among the components of the CSP LED device 1A during thermal cycles of the LED operation, by larger strain deformation of the soft buffer layer 20. Thus the failure mode of delamination of the packaging structure 200 from the LED semiconductor die 10 caused by the internal stress is greatly suppressed. That is, the soft buffer layer 20 functions as a stress relief layer. If the hardness of the soft buffer layer 20 is too high, the capability of the soft buffer layer 20 to sustain larger deformation is reduced. So is the impaired capability of relieving internal stress among the layers inside the packaging structure 200. It is desired that the hardness of the soft buffer layer 20 is not greater than A80 in Shore hardness scale, such as A70 or less, A60 or less, A50 or less, or A40 or less. The hardness of the soft buffer layer 20 is mainly determined by the material property. A suitable manufacturing material of the soft buffer layer 20 is selected based on the desired hardness. For example, the manufacturing material of the soft buffer layer 20 is a substantially transparent polymer material, including silicone, rubber, epoxy and so forth, with a desired hardness.

The photoluminescent structure 30 is disposed on the soft buffer layer 20 to partially down-convert the wavelength irradiated through the soft buffer layer 20 from the LED semiconductor die 10. Specifically, the photoluminescent structure 30 is formed conformally on the soft buffer layer 20 along the convex surface 211 and the extension surface 221 of the soft buffer layer 20.

Figure 1C:
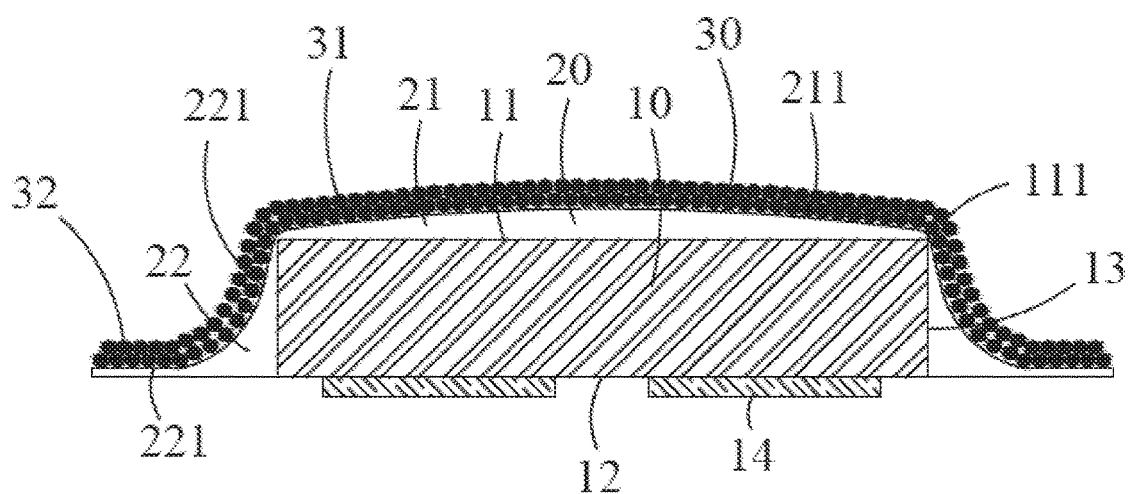
Figure 1D:
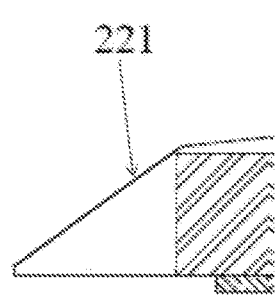
FIG. 1D and FIG. 1E are schematic drawings showing other shapes of an extension surface of a soft buffer layer according to other embodiments.
Figure 1E:
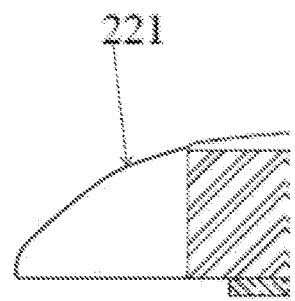

FIG. 1C is a cross-sectional view of the CSP LED device 1A without the encapsulant structure 40. The photoluminescent structure 30 includes a top portion 31 and an edge portion 32. The top portion 31 of the photoluminescent structure 30 is formed on the top portion 21 of the soft buffer layer 20, and the edge portion 32 of the photoluminescent structure 30 is formed on the edge portion 22 of the soft buffer layer 20. Since the convex surface 211 of the top portion 21 is smoothly and continuously connected to the extension surface 221 of the edge portion 22, the top portion 31 of the photoluminescent structure 30 can also be smoothly and continuously connected to the edge portion 32 of the photoluminescent structure 30.

The extension surface 221 is a relatively smooth surface with a smaller slope, which can smoothen out a steep "step" created by the edge surface 13 of the LED semiconductor die 10. In other words, the soft buffer layer 20 has a smooth-step profile and functions as a smooth layer to facilitate the formation of an approximate conformal coating of phosphor powder subsequently. For example, an angle that the extension surface 221 forms with a horizontal direction depicted in FIG. 1C can be in a range of less than 90 degrees, such as about 85 degrees or less, about 80 degrees of less, or about 75 degrees or less. When a coating process like spraying is used to form the photoluminescent structure 30, precipitation of a photoluminescent material caused by gravity inside a liquid polymer resin material over the smooth-step profile of the soft buffer layer 20 is greatly alleviated. Therefore a substantially continuous photoluminescent material layer is created covering the convex surface 211 and the extension surface 221 of the soft buffer layer 20. Thus, approximately conformal coating of a photoluminescent material to form the photoluminescent structure 30 is achieved. In other words, the photoluminescent structure 30 can be a thin film structure, which substantially conforms to the shape of the soft buffer layer 20, and approximately conforms to the shape of the LED semiconductor die 10. Accordingly, the blue light leakage issue in CPS LED devices is resolved.

The photoluminescent structure 30 includes a photoluminescent material and a resin material used to bind the photoluminescent material. For example, the binder material is selected from one of transparent polymer resin materials including silicone, epoxy, and rubber and so forth. The binder material can be the same as or different from the material used to form the soft buffer layer 20. The methods of forming a phosphor layer disclosed by the U.S. patent publication US2010/0119839 can be applied to form the photoluminescent structure 30 in various embodiments according to the present disclosure, and the technical contents of which are entirely incorporated by reference. Using the disclosed phosphor deposition method, a highly compact thin-phosphor layer can be formed as the photoluminescent structure 30. One advantage is that the phosphor particles are deposited as a uniform, thin, and compact conformal coating layer. Thus no substantially large "voids" of photoluminescent material will be formed accordingly. Consequently, the "blue light spots" phenomenon and the blue light leakage problem are resolved, and the risk of blue-light hazard to human eyes is reduced as well. Another advantage is that, once the photoluminescent structure 30 with a high packing density is formed in the embodiment of the CSP LED device 1A according to the present disclosure, the photoluminescent structure 30 shows improved conversion efficiency, and thus the overall optical efficacy of the CSP LED device 1A is improved. It will be appreciated that various photoluminescent materials and polymer resin materials with different refractive indices can be deposited layer-by-layer based on a desired deposition sequence to form the photoluminescent structure 30, therefore the light extraction efficiency and the light conversion efficiency can be further improved.

The photoluminescent structure 30 of the depicted embodiment includes a photoluminescent material and a polymer material. For comparative CSP LED devices, a photoluminescent structure is formed to be in direct contact with an LED semiconductor die. It will be appreciated that the photoluminescent structure generally comprises of a ceramic phosphor material in a form of a powder dispersed inside a polymer binder material. However, a ceramic material will typically not form a chemical bond with the LED semiconductor die during CSP fabrication process and thus has reduced adhesion strength with the LED semiconductor die. Adhesion strength between the photoluminescent structure and the LED semiconductor die are mainly developed from the polymer binder material. When the phosphor powder is dispersed inside the polymer binder material, it decreases the percentage of the contact area between the polymer material and the surface of LED semiconductor die, which accordingly reduces the bonding strength at the interface. In contrast, the soft buffer layer 20 provides full contact between a polymer material and the LED semiconductor die 10 for the CSP LED device 1A according to the present disclosure, and the photoluminescent structure 30 has a greater bonding strength with respect to the soft buffer layer 20 as compared to that with respect to the LED semiconductor die 10. Therefore, the bonding strength between the photoluminescent structure 30 and the LED semiconductor die 10 can be greatly improved by introducing the soft buffer layer 20. Thus the soft buffer layer 20 functions as an adhesion promotion layer.

As depicted in FIG. 1A, the encapsulant structure 40 formed on the photoluminescent structure 30 is disposed to protect the photoluminescent structure 30 as an environmentally protective structure. The encapsulant structure 40 may not conform to the shape of the photoluminescent structure 30 and the soft buffer layer 20. Instead, the encapsulant structure 40 can be fabricated as a planarization structure. A flat surface of the encapsulant structure 40 will facilitate pick-and-place handling by a robot arm during a subsequent assembly process to bond CSP LED devices onto a substrate.

The hardness of the encapsulant structure 40 is equal to or higher than that of the soft buffer layer 20. Desirably, the encapsulant structure 40 is harder than the soft buffer layer 20 to provide higher rigidity for better handling in a subsequent assembly process. Specifically, the hardness of the encapsulant structure 40 is desirably equal to or higher than D30 in Shore hardness scale, such as D35 or greater, D45 or greater, or D55 or greater.

The manufacturing material determines the hardness of the encapsulant structure 40. A suitable manufacturing material of the encapsulant structure 40 is selected based on the desired hardness. For example, the manufacturing material of the encapsulant structure 40 is a substantially transparent polymer material, including silicone, rubber, epoxy and so forth, with a desired hardness.

According to the detailed descriptions above, the CSP LED device 1A shows at least the following technical features. As for a comparative CSP LED device, the photoluminescent structure 30 is in direct contact with the LED semiconductor die 10. Presence of a ceramic phosphor material decreases the contact area between a polymer material and the LED semiconductor die 10 and thus reduces the bonding strength in between. By contrast, as for the CSP LED device 1A, the polymer material of the soft buffer layer 20 is in entire contact with the LED semiconductor die 10. Therefore the bonding strength between the photoluminescent structure 30 and the LED semiconductor die 10 is greatly increased by incorporating the soft buffer layer 20. Furthermore, the soft buffer layer 20 has lower hardness, which can sustain a larger strain deformation to relieve the internal stress induced by the mismatch of CTEs among the components in the CSP LED device 1A. Since the soft buffer layer 20 increases the bonding force and relieves the internal stress, the packaging structure 200 is not readily peeled off from the LED semiconductor die 10 by the internal stress caused by the thermal cycles during operation of the CSP LED device 1A. In other words, the device failure mode due to delamination is greatly avoided during operation of the CSP LED device 1A; or reliability is greatly improved.

As another technical feature of the CSP LED device 1A, the extension surface 221 of the edge portion 22 of the soft buffer layer 20 is a relatively smooth surface with a smaller gradient of slope, which smoothens the sharper vertical step of the edge surface 13 of the LED semiconductor die 10. Without a smooth and smaller gradient buffer layer 20, the phosphor powder tends to precipitate inside the binder material due to the gravity effect, therefore it may be difficult to retain the phosphor powder on the edge surface 13 of the LED semiconductor die 10 to form a continuous conformal coating with phosphor material. On the other hand, a soft buffer layer 20 according to the CSP device 1A can greatly reduce the effect of the precipitation of phosphor powder caused by gravity, and therefore a substantially continuous phosphor powder distribution is formed along the edge portion 22 of the soft buffer layer 20. In other words, an approximate conformal coating with phosphor powder inside the photoluminescent structure 30 is achieved. Therefore the issue of blue light leakage in CPS LED devices is resolved. Thus, the CSP LED device 1A according to the present disclosure shows better spatial color uniformity, and CCT binning consistency is improved as well.

As another technical feature of the CSP LED device 1A, a method of sequential deposition of the photoluminescent material and the polymer material can be used to form the photoluminescent structure 30. Using the disclosed phosphor deposition method, a highly compact thin-phosphor layer can be formed as the photoluminescent structure 30. One advantage is that the phosphor particles are deposited as a uniform, thin, and compact conformal coating layer. Thus no substantially large "voids" of photoluminescent material will be formed accordingly. Consequently, the "blue light spots" phenomenon and the blue light leakage problem are resolved, and the risk of blue-light hazard to human eyes is reduced as well. Another advantage is that, once the photoluminescent structure 30 with a high packing density is formed in the embodiment of the CSP LED device 1A, the photoluminescent structure 30 shows better conversion efficiency, and thus the overall optical efficacy of the CSP LED device 1A is improved. It will be appreciated that various photoluminescent materials and polymer resin materials with different refractive indices can be deposited layer-by-layer based on a desired deposition sequence to form the photoluminescent structure 30, therefore the light extraction efficiency and the light conversion efficiency can be further improved.

As another technical feature of the CSP LED device 1A, the refractive index of the encapsulant structure 40 can be chosen to be smaller than that of the photoluminescent structure 30, whose refractive index can be chosen to be smaller than that of the soft buffer layer 20. In other words, the index matching can by realized in the packaging structure 200. In other words, the refractive index of the packaging structure 200 is approaching to that of the ambient environment (e.g., air). Therefore, the total internal reflection (TIR) due to the difference of refractive indices along the light path can be reduced, and the light extraction efficiency of the CSP LED device 1A is improved accordingly.

As another technical feature of the CSP LED device 1A, slight deviations of geometric dimensions of the encapsulant structure 40 do not have a significant impact on the optical properties related to wavelength conversion since there is no photoluminescent material included inside the encapsulant structure 40. In other words, the fabrication processes determining the outer envelope dimensions of the encapsulant structure 40 (thus the outer envelope dimensions of the CSP LED device 1A), such as dicing, molding and so forth, will have more machining tolerances. However, the desired optical properties such as spatial color uniformity and CCT binning consistency of the CSP LED device 1A are not (or rarely) sacrificed under the deviations of the outer envelope dimensions due to machining tolerances.

As another technical feature of the CSP LED device 1A, the length and width of the outer envelope dimensions of the packaging structure 200 are on the same order of geometric dimensions as those of the LED semiconductor die 10. Compared with a PLCC-type LED package device, the package dimensions are about 3-20 times larger than those of an LED semiconductor die 10. It is desired that the outer envelope dimensions of the packaging structure 200 according to the embodiment of the CSP LED device 1A are not greater than or less than 100%, not greater than or less than 50%, or not greater than or less than 20% larger than those of the LED semiconductor die 10. In other words, the length and width of the packaging structure 200 are not greater than or less than 200%, not greater than or less than 150%, or not greater than or less than 120% of the corresponding length and width of the LED semiconductor die 10. Since there is no additional submount (not illustrated) disposed underneath the LED semiconductor die 10, the CSP LED device 1A possesses a compact form factor. Furthermore, based on the specifications in different applications, a reflective structure may be optionally disposed on the four peripheral edge surfaces (partially or entirely) of the packaging structure 200 to further define and restrict the viewing angle of the CSP LED device 1A.

As another technical feature of the CSP LED device 1A, it is desired that the manufacturing material to form the soft buffer layer 20 is chosen from polymer materials without containing substances (e.g., benzene) that will chemically react with the additives contained in soldering flux. A reflow soldering process is usually used when a CSP LED device is bonded onto an application substrate, such as a PCB. During the reflow soldering process, the soldering flux is typically utilized to improve the bonding quality between the CSP LED device and the substrate. However, the additives contained in the soldering flux tend to react with benzene, which is found in silicone binder materials. This chemical reaction will form an adverse dark layer on the lower surface of a photoluminescent structure 30 if it is made of the polymer material containing benzene. However, if the soft buffer layer 20 is comprised of a polymer material without or substantially devoid of benzene and is disposed according to the embodiment of FIG. 1A, it will isolate the photoluminescent structure 30 from touching the flux additives during the subsequent bonding process. Therefore, when the CSP LED device 1A is bonded onto a substrate through a reflow soldering process, the additives contained in soldering flux are substantially confined by the soft buffer layer 20 to the underneath area of the CSP LED device 1A and refrained from reaching the photoluminescent structure 30. Thus, this adverse chemical reaction is largely avoided between the additives of soldering flux and benzene (for example), which is found in silicone binder materials used to fabricate the photoluminescent structure 30. Accordingly, a dark layer resulted from this chemical reaction is greatly reduced, and another degradation mode on optical efficacy and reliability of the CSP LED device 1A is avoided. In other words, the soft buffer layer 20 also functions as an environmental barrier layer.

The aforementioned paragraphs are detailed descriptions of the embodiments related to the CSP LED device 1A. Detailed descriptions of other embodiments of CSP LED devices according to the present disclosure are explained as follows. It will be appreciated that some detailed descriptions of the features and advantages found in the following embodiments of the light emitting devices are similar to those of the CSP LED device 1A and are therefore omitted for the purpose of brevity.

Figure 2:
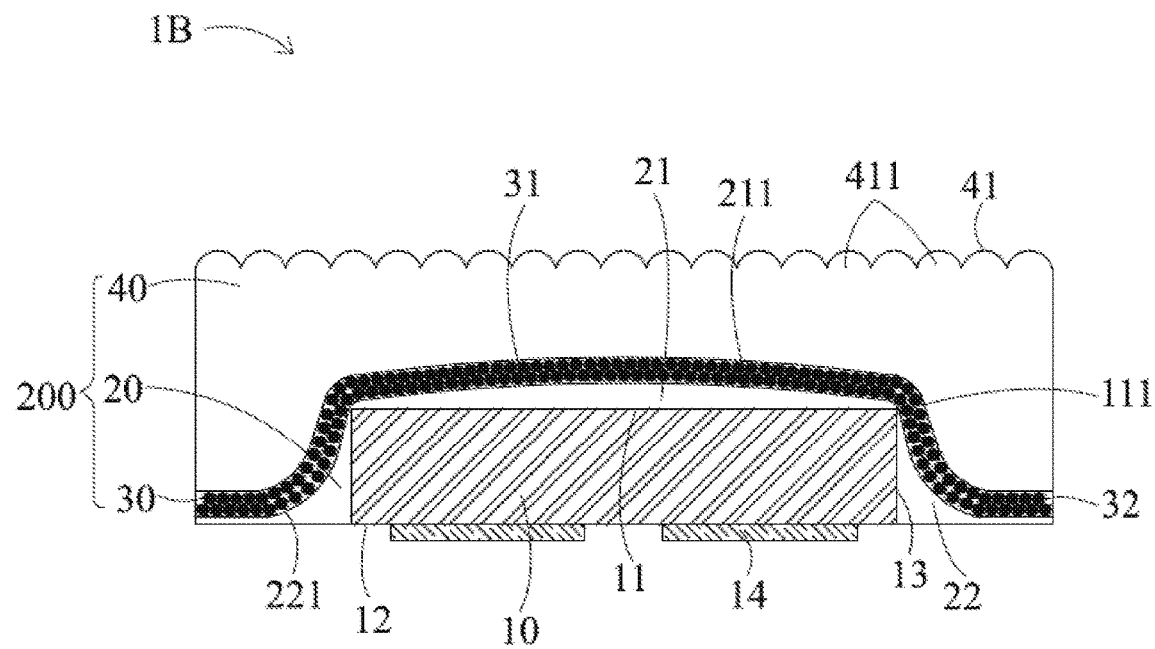
FIG. 2 is a schematic drawing in a cross-sectional view of a CSP LED device according to a second embodiment of the present disclosure.

FIG. 2 shows a schematic drawing in a cross-sectional view of a second embodiment of the CSP LED device according to the present disclosure. A difference between the CSP LED device 1B and the CSP LED device 1A is at least that the encapsulant structure 40 further incorporates a microstructure lens array layer 41. The microstructure lens array layer 41 and the encapsulant structure 40 may be fabricated together in one single process concurrently. The microstructure lens array layer 41 may comprise a plurality of microstructures 411 which are orderly or randomly arranged on the surface of the encapsulant structure 40. Other shape variants of the microstructure 411 may be a hemisphere, a pyramid, a cone, a pillar and so forth, or may be a roughened surface.

The microstructure lens array layer 41 can reduce the possibility of the light irradiated from inside of the CSP LED device 1B being reflected back due to Total Internal Reflection (TIR) at the interface of the encapsulant structure 40 with an ambient environment. Therefore it is easier for the light to escape out of the encapsulant structure 40. Thus, the light extraction efficiency of the encapsulant structure 40 is improved, and the optical efficacy of the CSP LED device 1B is increased.

Figure 3A:
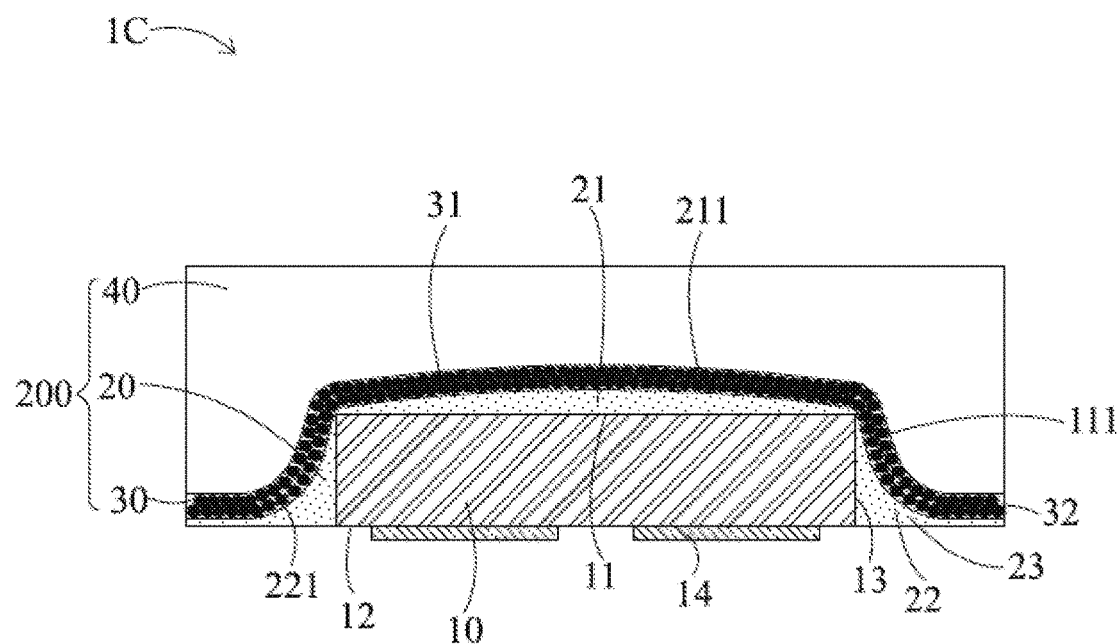
FIG. 3A, FIG. 3B, and FIG. 3C are schematic drawings in cross-sectional views of a CSP LED device according to a third embodiment of the present disclosure.
Figure 3B:
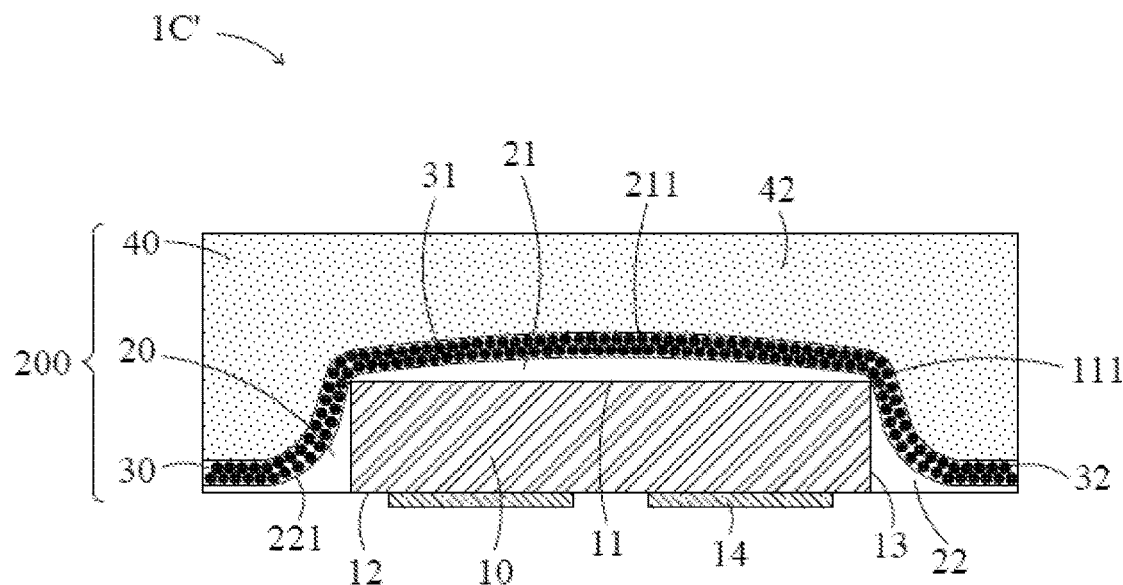
Figure 3C:
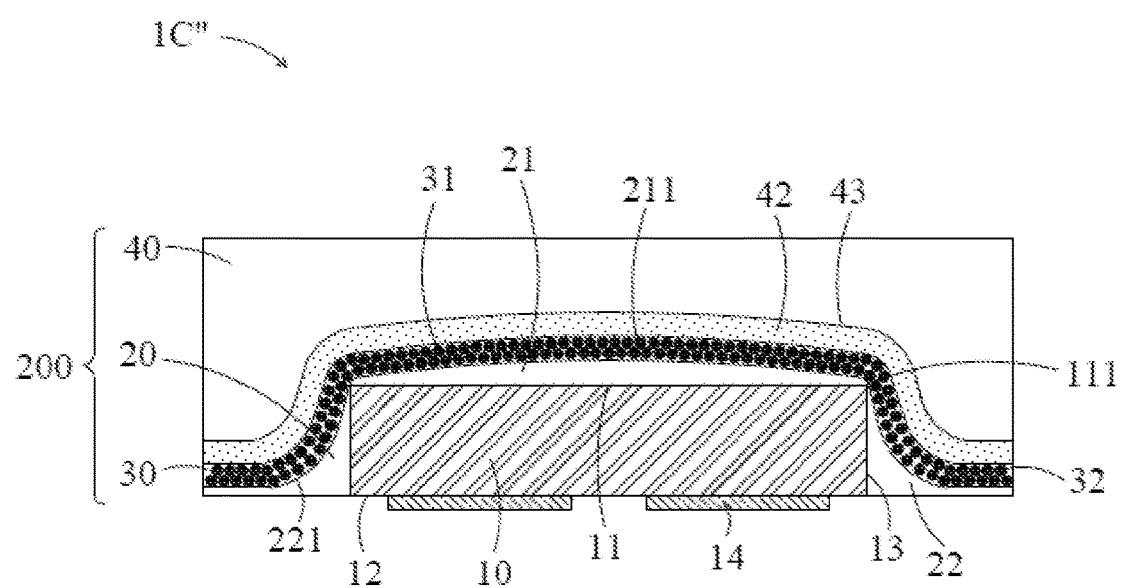

FIGS. 3A to 3C show schematic drawings in cross-sectional views of a third embodiment of the CSP LED device according to the present disclosure. A difference between the CSP LED device 1C and the CSP LED device 1A is that, as shown in FIG. 3A, the soft buffer layer 20 of the CSP LED device 1C may further include light scattering particles 23. As shown in FIGS. 3B and 3C, the encapsulant structure 40 may further include light scattering particles 42 to form CSP LED devices 1C' and 1C". Both the soft buffer layer 20 and the encapsulant structure 40 may include light scattering particles simultaneously (not illustrated).

Light will be diffused by the scattering particles 23 and 42 of the devices 1C-1C". So the optical performances, such as the spatial color uniformity, of the CSP LED devices 1C-1C" can be further improved. The light scattering particles 23 and 42 may be chosen from inorganic materials such as $TiO_2$, $SiO_2$, BN, $Al_2O_3$, other metal or non-metal oxides and so forth. The light scattering particles 23 may be uniformly distributed inside the soft buffer layer 20 (as shown in FIG. 3A), and the light scattering particles 42 may also be uniformly distributed inside the encapsulant structure 40 (as shown in FIG. 3B). In addition, as shown in FIG. 3C, the distribution of the light scattering particles 42 may be formed as a conformal layer on the photoluminescent structure 30 and inside the encapsulant structure 40, such as forming a light scattering layer 43.

For the CSP LED devices 1A to 1C described above, each component, such as the soft buffer layer 20, the photoluminescent structure 30, or the encapsulant structure 40, may be formed as a single-layer structure or a multi-layer structure. If each component is a single-layer structure, it is formed through solidifying the manufacturing material by a single curing process, and each of them is formed as a single curing process. If each component has a multi-layer structure, it is formed through solidifying the manufacturing material(s) by multiple curing processes.

The following paragraphs describe a fabrication method for some embodiments of CSP LED devices according to the present disclosure. The fabrication method provides a way to manufacture the LED devices that are essentially the same as or similar to the CSP LED devices 1A to 1C as illustrated from FIG. 1 to FIG. 3. It will be appreciated that some detailed descriptions of the variants of the manufacturing methods are therefore omitted for the purpose of brevity.

FIGS. 4A to 4F show a sequence of fabrication stages for manufacturing CSP LED devices according to some embodiments of the present disclosure. This manufacturing process includes at least three fabrication stages: disposing a plurality of LED semiconductor dies 10 on a release layer 300; forming a plurality of packaging structures 200 on the plurality of LED semiconductor dies 10, and singulating the plurality of packaging structures 200. The detailed technical aspects of each fabrication stage are described as follows.

Figure 4A:
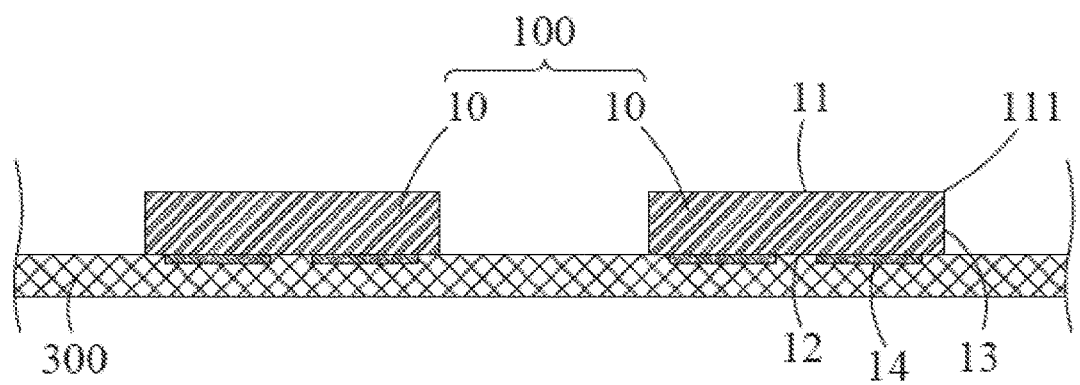
FIG. 4A, FIG. 4B, FIG. 4C, FIG. 4D, FIG. 4E, and FIG. 4F are schematic drawings in cross-sectional views illustrating stages of a manufacturing method to form a CSP LED device according to some embodiments of the present disclosure.

As shown in FIG. 4A, the release layer 300, such as a release film, is prepared first, and the release layer 300 may be disposed on a substrate (for example, on a silicon substrate or a glass substrate, not illustrated). Subsequently, the plurality of LED semiconductor dies 10 (two LED semiconductor dies 10 are illustrated by example) are disposed on the release layer 300 to form an array 100 of the LED semiconductor dies 10. It is desired that the set of electrodes 14 of each of the LED semiconductor die 10 is embedded into the release layer 300 so that the lower surface 12 of the LED semiconductor die 10 is adhered to and covered by the release layer 300.

Figure 4B:
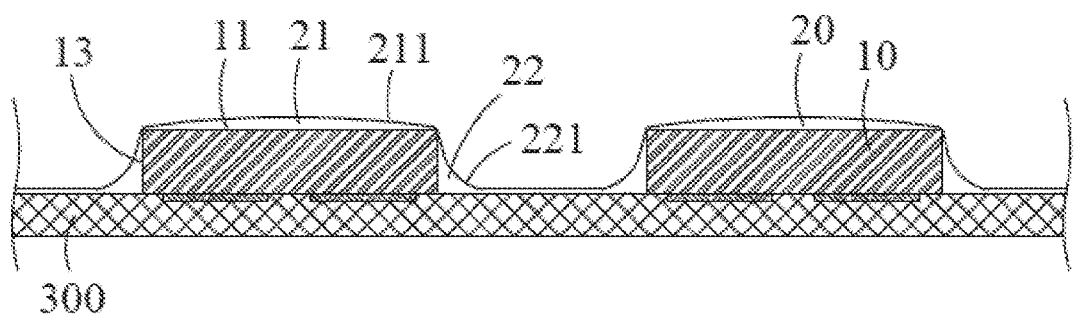
Figure 4C:
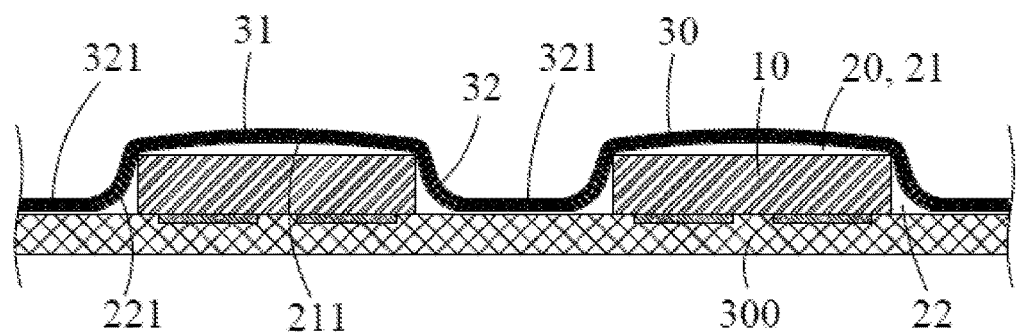
Figure 4D:
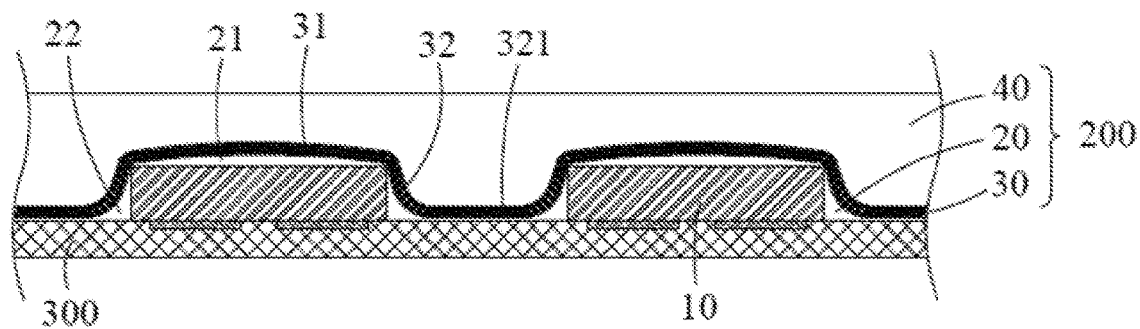

As shown in FIGS. 4B to 4D, after the arrangement to form the array 100 of LED semiconductor dies 10 disposed on the release layer 300, the plurality of packaging structures 200 are formed on the array 100 of the LED semiconductor dies 10. In this fabrication stage the plurality of packaging structures 200 are connected to one another. Specifically, the procedure of forming the packaging structure 200 on the LED semiconductor die 10 is detailed in three stages as follows.

In a first stage to form the packaging structure 200 on the LED semiconductor die 10, as shown in FIG. 4B, an array of the soft buffer layers 20 is formed on the array 100 of the LED semiconductor dies 10. Specifically, a liquid polymer material used to fabricate the soft buffer layer 20 is sprayed onto the array 100 of the LED semiconductor dies 10, and then the liquid polymer material spreads out and adheres to the upper surface 11 and the edge surface 13 of each of the LED semiconductor dies 10 (the liquid polymer material also spreads out on the release layer 300). Through the interaction and balance of surface tension and coherent force of the liquid polymer material itself, the soft buffer layer 20 (for example, including the convex top portion 21 and the concave edge portion 22 as described in the first embodiment of FIG. 1A) is formed. Next, the liquid polymer material is cured and solidified. Accordingly, the highest point of the soft buffer layer 20 is formed near the center point of the upper surface 11 and is aligned with the optical axis of the LED semiconductor die 10.

In addition to the spraying process, the liquid polymer material used to fabricate the soft buffer layer 20 may be coated on the array 100 of the LED semiconductor dies 10 by spin-coating or the like. It will be appreciated that the light scattering particles 23 may be pre-mixed inside the liquid polymer material. Thus the soft buffer layer 20 including the light scattering particles 23 according to the embodiment of the CSP LED device 1C shown in FIG. 3A is formed accordingly.

In a second stage to form the packaging structure 200 on the LED semiconductor die 10, as shown in FIG. 4C, an array of the photoluminescent structures 30 is conformally coated on the array of the soft buffer layers 20 over the convex surface 211 and the extension surface 221. It is desired that the conformal photoluminescent structure 30 is formed using the method disclosed in the U.S. patent publication US2010/0119839. Specifically, a carrier substrate transporting the array 100 of the LED semiconductor dies 10 and the array of the soft buffer layers 20 prepared by the aforementioned fabrication stage is placed inside a process chamber (not illustrated), so that the photoluminescent material and the polymer material are deposited conformally on the surface of the carrier substrate, respectively. To fabricate the photoluminescent structure 30, densely packed photoluminescent particles are dispersed inside the process chamber and uniformly deposited onto the carrier substrate; and then the carrier substrate is placed inside another process chamber, so that a polymer material may be subsequently deposited onto the carrier substrate to bind the photoluminescent particles together as a composite photoluminescent layer. This fabrication process to prepare the layer of the photoluminescent particles and to prepare the polymer binder layer may be executed in a reverse order.

It will be appreciated that when the photoluminescent structure 30 is formed through the aforementioned conformal coating process, although precise arrangement to form an array 100 of the LED semiconductor dies 10 on the release layer 300 may be challenging, the plurality of photoluminescent structures 30 can still be uniformly and symmetrically formed over the array 100 of the LED semiconductor dies 10 due to the nature of a conformal coating process, thus suitable for mass production. In contrast, when the photoluminescent structures are formed by methods of molding or screen-printing, imprecise arrangement of an array of LED semiconductor dies will affect the uniformity and symmetry of the photoluminescent structure.

In a third stage to form the packaging structure 200 on the LED semiconductor die 10, as shown in FIG. 4D, an array of encapsulant structures 40 is formed on the array of photoluminescent structures 30. In the process of forming the encapsulant structure 40, a liquid polymer material used to fabricate the encapsulant structure 40 is disposed on the photoluminescent structure 30 by, for example, dispensing, spraying, molding, spin-coating, and so forth, and is subsequently solidified by heat curing. In addition, the light scattering particles 42 may be pre-mixed inside the liquid polymer material. Thus the encapsulant structure 40 having the light scattering particles 42, according to the embodiment shown in FIG. 3B, is formed.

If the encapsulant structure 40 further includes the microstructure lens array layer 41, as shown in FIG. 2, the microstructure lens array layer 41 may be formed on the encapsulant structure 40 at the same time of, or after, forming the encapsulant structure 40. If using a molding process, the encapsulant structure 40 and the microstructure lens array layer 41 can be formed concurrently in one single process.

Figure 4E:
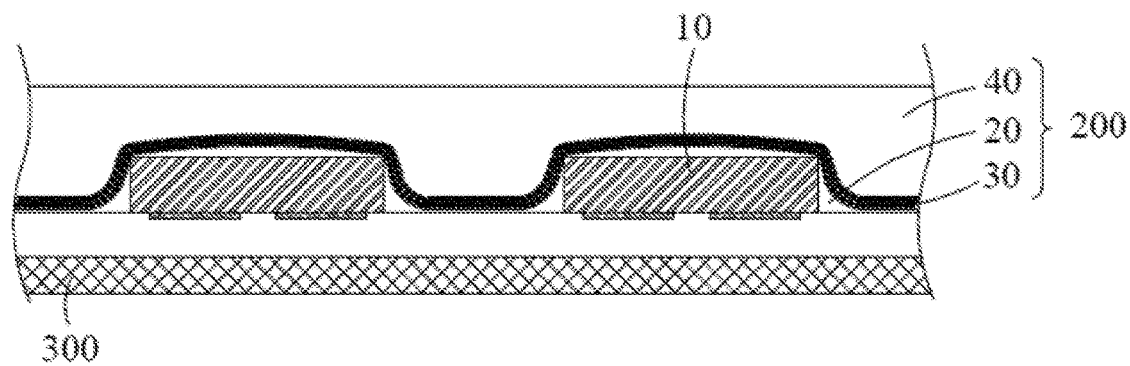
Figure 4F:
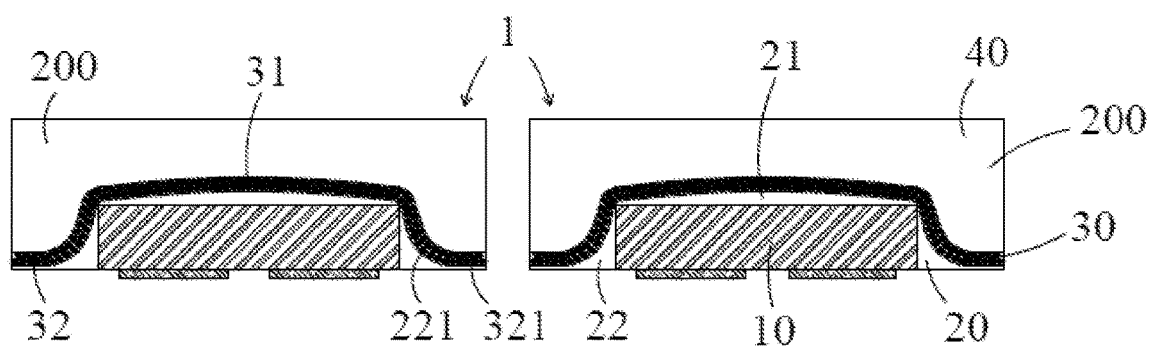

Using the fabrication process to form the packaging structure 200 on the LED semiconductor die 10, a plurality of connected packaging structures 200 are formed covering the plurality of LED semiconductor dies 10. Then, as shown in FIG. 4E, the release layer 300 is removed. Subsequently, as shown in FIG. 4F, the plurality of connected packaging structures 200 are singulated by dicing to obtain a plurality of separated CSP LED devices 1. Alternatively, the release layer 300 may be removed after singulating the plurality of packaging structures 200.

During the fabrication process to singulate the plurality of connected packaging structures 200, it is desired that a cutting tool (for example, a saw) is used to separate the packaging structures 200 evenly at the locations where the extension surface 221 of the soft buffer layer 20 has the smallest curvature or slope. In other words, the cutting location tends to be further away from the edge surface 13 of the LED semiconductor die 10. Therefore, the packaging structure 200 is diced at a relatively leveled section, or the level section 321 of the edge portion 32 of the photoluminescent structure 30. In this way, spatial color uniformity of the CSP LED device 1 will not be significantly affected by deviations within dicing position tolerances. Specifically, the position tolerances for a dicing process may cause asymmetric dimensions of the level section 321 of the photoluminescent structure 30 for the CSP LED device 1. However, the size variations in the level section 321 hardly affects the spatial color uniformity because the light irradiated from the LED semiconductor die 10 has a range of viewing angles and rarely passes through the level section 321.

In summary for some embodiments, the manufacturing method of the CSP LED devices according to the present disclosure provides a way to fabricate the LED device 1 in a batch process suitable for mass production. According to the aforementioned embodiments, the CSP LED devices 1 show improved reliability, improved spatial color uniformity, more consistent CCT binning, and higher optical efficacy and is realized in a much smaller form factor.

Additionally, according to the manufacturing method disclosed herein, a mold may be omitted to fabricate the CSP LED device 1. In other words, the size of a CSP LED device 1 is not specified by the size of a mold; instead, it is determined by the arranged pitch of the array of the LED semiconductor dies 10. Therefore, the disclosed manufacturing method is highly scalable and applicable to fabricate a wide range of dimensions of a CSP LED device.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:
1. A light emitting device comprising:
a flip-chip light emitting diode (LED) semiconductor die comprising an upper surface, a lower surface opposite to the upper surface, an edge surface, and a set of electrodes, wherein the edge surface extends between the upper surface of the LED semiconductor die and the lower surface of the LED semiconductor die, and the set of electrodes is disposed on the lower surface of the LED semiconductor die; and a packaging structure comprising:

a transparent soft buffer layer comprising a top portion and an edge portion, wherein the top portion is disposed in direct contact with the upper surface of the LED semiconductor die and comprises a convex surface, the edge portion is disposed in direct contact with the edge surface of the LED semiconductor die and comprises an extension surface, and the convex surface of the top portion of the transparent soft buffer layer adjoins the extension surface of the edge portion of the transparent soft buffer layer;

a photoluminescent structure disposed on the transparent soft buffer layer over the convex surface and the extension surface; and an encapsulant structure disposed on the photoluminescent structure, wherein a hardness of the transparent soft buffer layer is selected so that the transparent soft buffer layer functions as a stress relief layer during thermal cycles of operating the light emitting device;

wherein the hardness of the transparent soft buffer layer is selected to be not greater than A80 in Shore hardness scale; and wherein the hardness of the encapsulant structure is not lower than D30 in Shore hardness scale.

2. The light emitting device according to claim 1, wherein a width and a length of the packaging structure is not greater than 200% of a width and a length of the LED semiconductor die.

3. The light emitting device according to claim 1, wherein the upper surface of the LED semiconductor die has a rim, and a border of the convex surface and the extension surface of the transparent soft buffer layer is tangent or adjacent to the rim of the upper surface of the LED semiconductor die.

4. The light emitting device according to claim 3, wherein the convex surface and the extension surface of the transparent soft buffer layer have a same curvature at the border.

5. The light emitting device according to claim 1, wherein a shape of the extension surface of the transparent soft buffer layer is concave, beveled, or convex.

6. The light emitting device according to claim 1, wherein a material of the transparent soft buffer layer comprises at least one of silicone, epoxy, or rubber, and a material of the encapsulant structure comprises at least one of silicone, epoxy, or rubber.

7. The light emitting device according to any one of claims 1 to 5 and 6, wherein the encapsulant structure further comprises a microstructure lens array layer.

8. The light emitting device according to any one of claims 1 to 5 and 6, wherein at least one of the transparent soft buffer layer or the encapsulant structure comprises light scattering particles.

9. The light emitting device according to any one of claims 1 to 5 and 6, wherein the encapsulant structure further comprises a light scattering layer comprising light scattering particles and covering the photoluminescent structure.

10. The light emitting device according to any one of claims 1 to 5, wherein each component of the packaging structure comprises at least one layer of a polymer resin material.

11. The light emitting device according to claim 1, wherein a shape of the extension surface of the transparent soft buffer layer is concave.

12. The light emitting device according to claim 1, wherein the photoluminescent structure is disposed in direct contact with the convex surface and the extension surface of the transparent soft buffer layer.

13. The light emitting device according to claim 1, wherein the encapsulant structure is disposed in direct contact with the photoluminescent structure.

14. The light emitting device according to claim 1, wherein a wavelength of light passing through the transparent soft buffer layer from the LED semiconductor device remains substantially unchanged.

15. The light emitting device according to claim 1, wherein the transparent soft buffer layer is substantially free of light altering particles.

* * * * *